United States Patent
Gardner et al.

[19]

[11] Patent Number: 6,060,767
[45] Date of Patent: May 9, 2000

[54] SEMICONDUCTOR DEVICE HAVING FLUORINE BEARING SIDEWALL SPACERS AND METHOD OF MANUFACTURE THEREOF

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/183,019

[22] Filed: Oct. 30, 1998

Related U.S. Application Data

[62] Division of application No. 08/822,223, Mar. 21, 1997, Pat. No. 5,923,949.

[51] Int. Cl.[7] .............................................. H01L 21/8234
[52] U.S. Cl. .......................... 257/645; 257/651; 257/900
[58] Field of Search ..................................... 257/405, 410, 257/900, 645, 651

[56] References Cited

U.S. PATENT DOCUMENTS

| | | | |
|---|---|---|---|
| 5,552,332 | 9/1996 | Tseng et al. | 437/40 |
| 5,599,726 | 2/1997 | Pan | 437/41 |
| 5,672,525 | 9/1997 | Pan | 437/41 |
| 5,849,643 | 12/1998 | Gilmer et al. | 438/773 |
| 5,907,777 | 5/1999 | Joseph et al. | 438/275 |

*Primary Examiner*—Donald L. Monin, Jr.

[57] ABSTRACT

Fluorine bearing spacers on the sidewalls of gate electrodes of a semiconductor device are provided to suppress hot carrier injection in the semiconductor device. In accordance with one embodiment of the invention, a semiconductor device is formed by forming at least one gate electrode on a surface of a substrate and forming fluorine bearing spacers on the sidewalls of the gate electrode. The fluorine bearing spacers may, for example, be formed of an $NF_3$-doped glass material.

12 Claims, 4 Drawing Sheets

6,060,767

SEMICONDUCTOR DEVICE HAVING FLUORINE BEARING SIDEWALL SPACERS AND METHOD OF MANUFACTURE THEREOF

This application is a Divisional of application Ser. No. 08/822,223, filed Mar. 21, 1997 now U.S. Pat. No. 5,923,449 which application(s) are incorporated herein by reference.

FIELD OF THE INVENTION

The present invention is directed generally to a semiconductor device and method of manufacture thereof and, more particularly, to such a semiconductor device having fluorine bearing sidewall spacers.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 is typically a heavily doped conductor having uniform conductivity. An input signal is typically applied to the gate electrode 103 via a gate terminal (not shown). Heavily doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain. A channel region 107 is formed in the semiconductor substrate 101 beneath the gate electrode 103 and separates the source/drain regions 105. The channel is typically lightly doped with a dopant type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral as well as vertical dimensions of the device structure.

If the transverse electric field generated in a MOS device becomes sufficiently strong, it can give rise to hot carrier effects which can significantly degrade device performance. The problems associated with hot carrier effects are particular pronounced in short channel devices (having, for example, submicron channel lengths) and serve to limit scaling down of semiconductor devices.

One of the more important hot carrier effects is hot-carrier injection of electrons into the gate oxide and/or gate electrode. Hot carrier injection generally causes a deleterious gate current (when the electrons pass into the gate electrode) and an undesirable increase in the threshold voltage of the device (when the electrons are trapped in the gate oxide).

A number of different approaches have been proposed for suppressing hot carrier injection. In one approach, it has been proposed to integrate fluorine into the gate oxide or gate oxide-silicon interface. Another proposed solution is to reduce the amount of hydrogen that is incorporated in the gate oxide-silicon interface. Despite these processes, hot carrier injection persists and continues to limit further scaling down of semiconductor devices. A more detailed description of hot carrier effects may be found in S. Wolf, *Silicon Processing for the VLSI Era*, Vol. 2: Processing Integration, Chap. 5, pp. 348–363.

SUMMARY OF THE INVENTION

Generally, the present invention provides fluorine bearing spacers on the sidewalls of gate electrodes of a semiconductor device. The fluorine bearing spacers advantageously suppress hot carrier injection into the gate electrode.

In accordance with one embodiment of the invention, a semiconductor device is formed by forming at least one gate electrode on a surface of a substrate. Fluorine bearing spacers are formed on the sidewalls of the gate electrode. The fluorine bearing spacers may, for example, be formed of an $NF_3$-doped glass material. A semiconductor device in accordance with one aspect of the invention includes one or more gate electrodes disposed on a substrate and fluorine bearing spacers disposed on the sidewalls of the gate electrodes.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
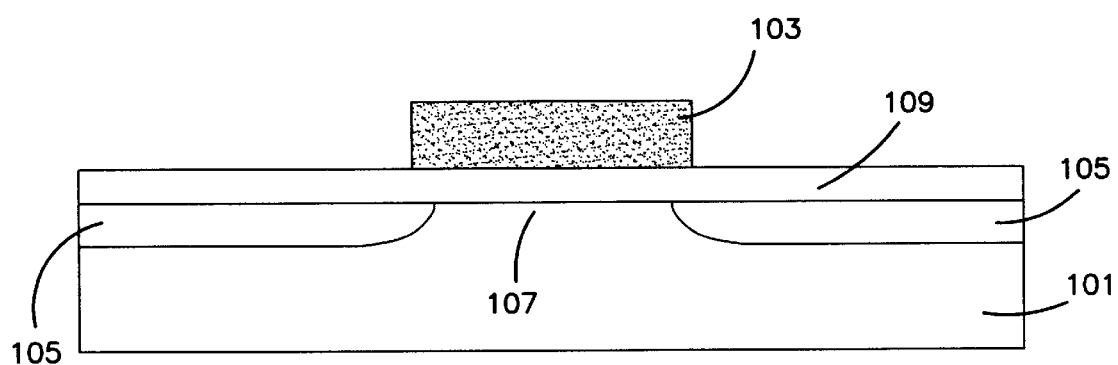
FIG. 1 illustrates one typical MOS semiconductor device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices, including in particular MOS and CMOS structures. While the present invention is not so limited, an appreciation of various aspects of the invention will be gained through a discussion of the fabrication process and characteristics of such a device in connection with the examples provided below.

Figure 2A:
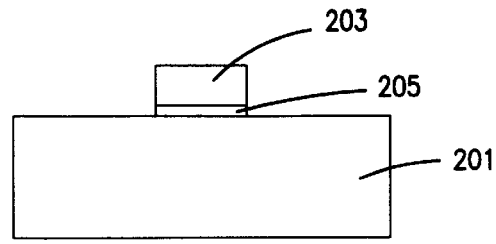
FIGS. 2A–2E illustrate a fabrication process in accordance with one embodiment of the invention.

FIGS. 2A–2E illustrate a process for fabricating a semiconductor device with a fluorine bearing sidewall spacer. Using known techniques, one or more gate electrodes (only one of which is shown) are formed on a substrate 201. The gate electrode 203 is typically insulated from the substrate 201 by a thin gate oxide 205. The resultant structure is illustrated in FIG. 2A. It will be appreciated that a number of different known fabrication techniques could be used to obtain the gate electrode structure depicted as FIG. 2A.

Figure 2B:
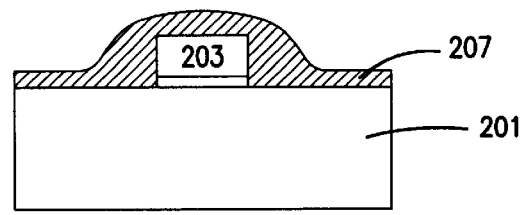

A spacer layer 207 containing a fluorine bearing species, such as $NF_3$, is formed over the substrate 201, as illustrated in FIG. 2B. The spacer layer 207 may, for example, be formed by depositing an $NF_3$-doped glass using well-known techniques. In alternate embodiments, the fluorine bearing spacer layer 207 may be formed by implanting a fluorine bearing species into a spacer layer formed of an oxide, such as $SiO_2$. The presence of fluorine in the spacer layer 207 is used to reduce the susceptibility of the resultant semiconductor device to hot carrier injection of electrons into the gate electrode and/or gate oxide. The concentration of fluorine is suitably selected to optimize this effect. The depth of the spacer layer 207 varies with design parameters. Spacer layer 207 depths of 300 to 2000 Å would be suitable for many applications.

Figure 2C:
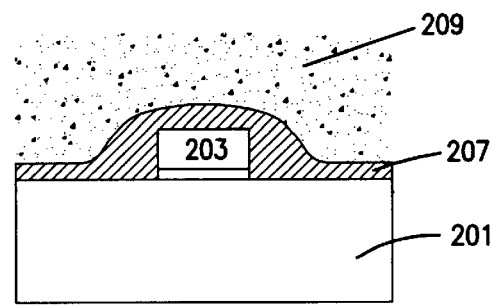

The substrate 201 with fluorine bearing spacer layer may be annealed in a nitrogen bearing ambient 209, as illustrated in FIG. 2C, to increase the concentration of nitrogen in the spacer layer 207 as desired. The presence of nitrogen in the spacer layer 207 also serves to decrease the susceptibility of the device to hot carrier injection effects. The nitrogen bearing ambient may include one or more nitrogen bearing species, such as NO, $N_2O$ or $NH_3$. The ambient concentration of the nitrogen-bearing species as well as the annealing temperature is selected based on the desired concentration of nitrogen in the spacer layer.

Figure 2D:
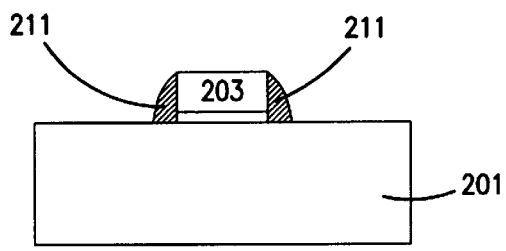
Figure 2E:
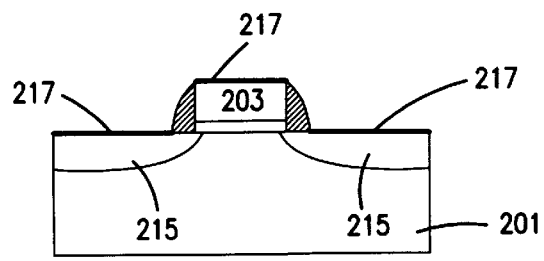

Fluorine bearing spacers 211 are formed on the sidewalls of the gate electrode 203. Spacer formation may be done by conventional deposition and etching techniques. The resultant structure is shown in FIG. 2D. Fabrication may continue with conventional processing steps to form a complete device structure. For example, a source/drain implant may be performed to activate the gate electrodes 203 and form source/drain regions 215 adjacent the gate electrodes 203. A silicidation layer 217 may then be formed over the source/drain regions 215 and gate electrodes 203 to prepare these structures for contacts. The exemplary source/drain implant and silicidation may be done using well-known equipment and techniques. The resultant structure is illustrated in FIG. 2E.

Generally, where the substrate 201 is annealed in a nitrogen-bearing ambient, it is annealed after forming the spacer layer 207 but prior to forming the spacers 211. This prevents ambient nitrogen from penetrating the substrate 201 and suppressing subsequent oxide growth thereon. However, in alternate embodiments, the substrate may be annealed in a nitrogen-bearing ambient after the formation of spacers 211. This provides an increased nitrogen in the spacers 211 as well as in the substrate 201, both of which may be desirable. Moreover, the nitrogen-ambient anneal after spacer formation may be performed in addition to or in place of the above-mentioned nitrogen ambient anneal.

While the above-described embodiment illustrates the formation of fluorine bearing spacers from a fluorine bearing spacer layer the present invention is not so limited. For example, fluorine bearing spacers may be formed by implanting a fluorine bearing species into spacers after etching a spacer layer of $SiO_2$.

Using the above process, semiconductor devices having fluorine bearing spacers may be formed. The presence of fluorine in the sidewall spacers advantageously serves to suppress hot carrier injection in the device. The presence of nitrogen serves to further reduce this effect. This allows for further scaling of device dimensions.

The use of fluorine bearing spacers also provides a more reliable device that has a longer lifetime. generally, hot carrier injection effects increase over the life of a given device. The presence of fluorine advantageously suppresses the hot carrier effects over the life of the device. Where nitrogen is incorporated in the spacers these effects are further suppressed.

The above processes can be used to form a number of different semiconductor devices, including but not limited to MOS structures such as p-type MOS devices (PMOS), n-type MOS devices (NMOS), and complimentary MOS (CMOS) semiconductor devices having both PMOS and NMOS devices. In addition, the above process can be used in conjunction with a number of different types of source/drain regions. For purposes of illustration, a process of forming a CMOS device having lightly-doped drain (LDD) source/drain regions is provided in FIGS. 3A–3G.

Figure 3A:
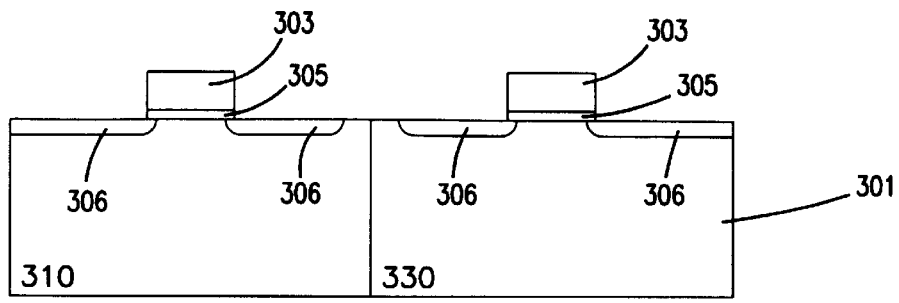
FIGS. 3A–3G illustrate another fabrication process in accordance with another embodiment of the invention.

Using known techniques, NMOS device regions 310 and PMOS device regions 330 (only one of each type of device region is shown) are defined in a substrate 301 and a gate electrode 303 is formed in each region. The gate electrodes 303 are typically insulated from the substrate by a thin gate oxide layer 305. Lightly-doped regions 306 are formed in the substrate 301 adjacent the gate electrodes 303. The resultant structure is shown in FIG. 3A. The lightly-doped regions 306 will be used to form lightly-doped drain (LDD) source/drain regions, as illustrated in FIG. 3G.

It should be appreciated that the term device region as used herein refers to a region of the substrate associated with a MOS device having a particular type of channel. The channel type, n-type or p-type, of a channel is identified based on the conductivity type of the channel developed under the transverse electric field. This means that an NMOS device region, for example, includes an n-type channel under a transverse electric field and is typically associated with an n-type doped active region and gate electrode.

Figure 3B:
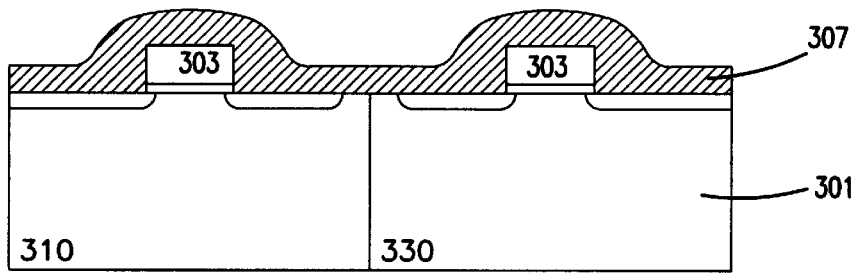

A spacer layer 307 containing a fluorine bearing species, such as $NF_3$, is formed over the substrate 301, as illustrated in FIG. 3B. The spacer layer 307 may, for example, be formed by depositing an $NF_3$-doped glass or implanting a fluorine bearing species into an oxide layer, as discussed above. The presence of fluorine in the spacer layer 307 is used to decrease the susceptibility of the device to hot carrier injection. The concentration of fluorine is suitably selected to optimize this effect. The depth of the spacer layer 307 varies with design parameters. Spacer layer 307 depths of 300 to 2000 Å would be suitable for many applications.

Figure 3C:
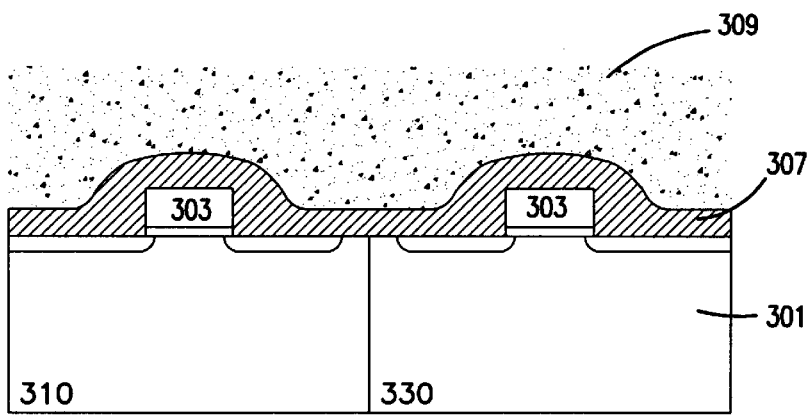

The substrate 301 with the fluorine bearing spacer layer may be annealed in a nitrogen bearing ambient 309, as illustrated in FIG. 3C, to increase the concentration of nitrogen in the spacer layer 307 as desired. The presence of nitrogen further suppresses hot carrier injection in the device. The nitrogen bearing ambient may include one or more nitrogen bearing species, such as NO, $N_2O$ or $NH_3$. The ambient concentration of the nitrogen-bearing species as well as the annealing temperature is selected based on the on the desired concentration of nitrogen in the spacer layer. In alternate embodiments, a nitrogen-ambient anneal may be performed after spacer formation, as discussed above.

Figure 3D:
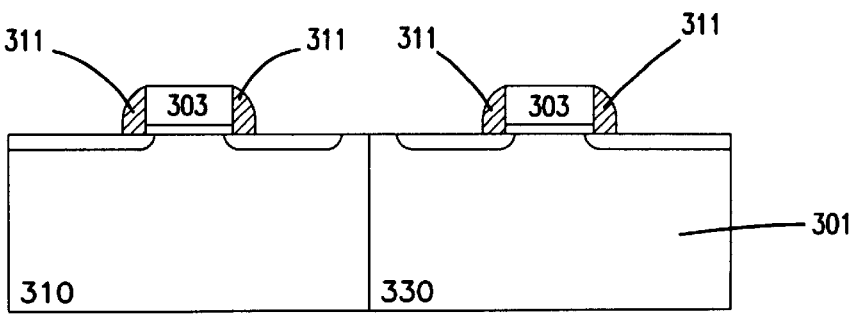

Fluorine bearing spacers 311 are formed on the sidewalls of the gate electrodes 303. Spacer formation may be done by conventional deposition and etching techniques. The resultant structure is shown in FIG. 3D. Fabrication may continue with conventional processing steps to form a complete device structure.

Figure 3E:
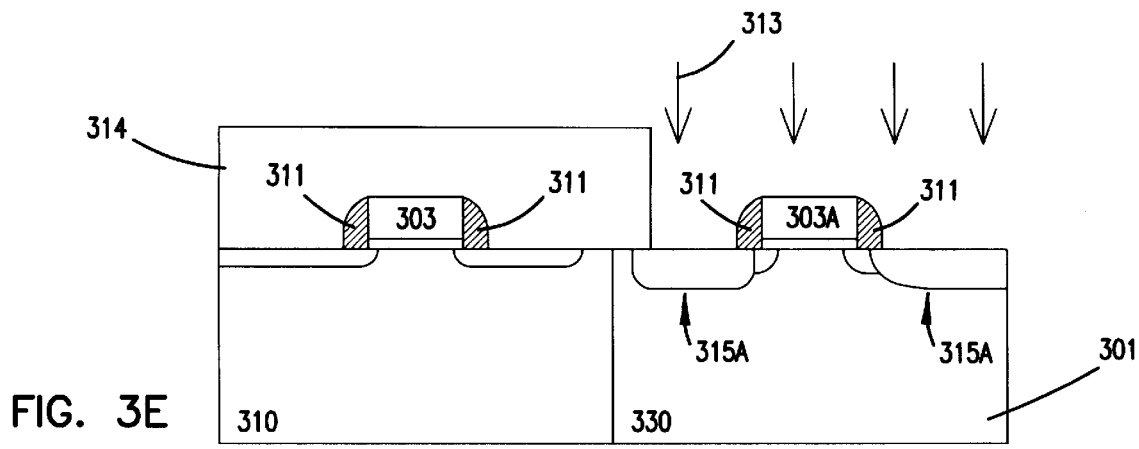
Figure 3F:
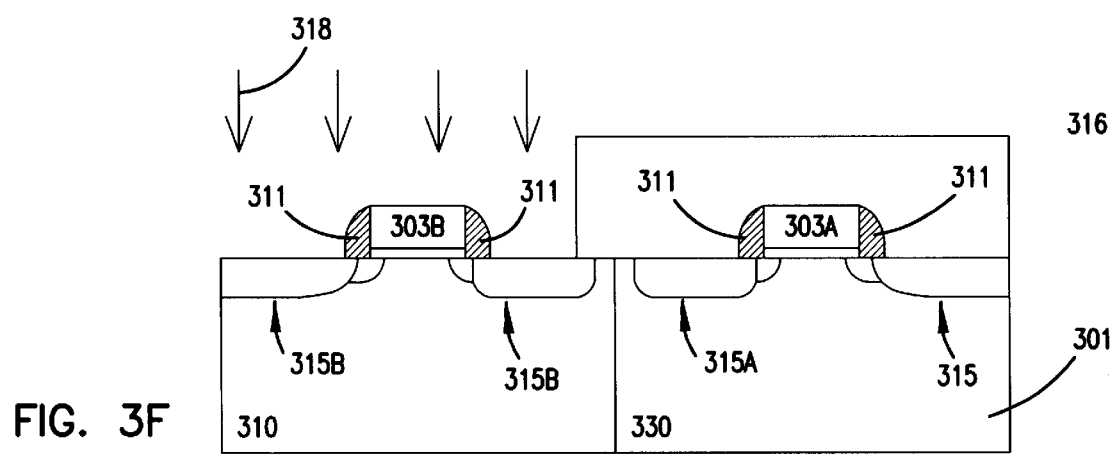
Figure 3G:
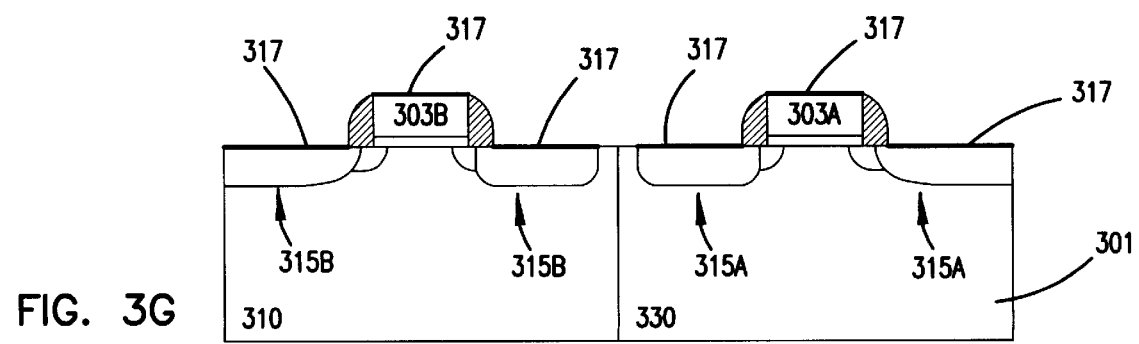

Exemplary fabrication steps are illustrated in FIGS. 3E–3G. A mask 314 may be formed over the NMOS device region 310 and a source/drain implant of a p-type dopant (as illustrated by arrows 313 in FIG. 3E) may be performed in the PMOS device region 330 to activate the PMOS gate electrode 303A and form source/drain regions 315A adjacent PMOS the gate electrode 303A. The resultant structure is illustrated in FIG. 3E. The mask 314 may be removed and a mask 316 formed over the PMOS device region 310 to selectively expose the NMOS device region 330. A source/drain implant of an n-type dopant (as illustrated by arrows 318 in FIG. 3F) may be performed in the NMOS device region 310 to activate the NMOS gate electrode 303B and form source/drain regions 315B adjacent the NMOS gate electrode 303B. The resultant structure is illustrated in FIG. 3F.

A silicidation layer 317 may then be formed over the source/drain regions 315A and 315B and gate electrodes 303A and 303B to prepare these structures for contact formation. The exemplary source/drain implants and silicidation may be done using well-known equipment and techniques.

Using the above process, LDD CMOS semiconductor devices having fluorine (and if desired nitrogen) bearing spacers may be formed. As discussed above, the presence of fluorine (and nitrogen) in the sidewall spacers advantageously provide a more reliable device and decreases the hot carrier injection susceptibility of the device. This allows for further scaling of device dimensions.

As noted above, the present invention is applicable to the fabrication of a number of different devices, such as PMOS, NMOS, and CMOS devices, having fluorine bearing spacers adjacent a gate electrode. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A semiconductor device, comprising:

a substrate;

a gate electrode disposed on the substrate; and fluorine bearing spacers disposed on the sidewalls of the gate electrode, each of the fluorine bearing spacers having fluorine and nitrogen.

2. The semiconductor device of claim 1, wherein the fluorine bearing spacers are comprised of $NF_3$ doped glass.

3. The semiconductor device of claim 1, wherein each fluorine bearing spacer extends from a top of the gate electrode to a surface of the substrate.

4. The semiconductor device of claim 3, wherein each of the fluorine bearing spacers layer has a thickness of at least 1000 angstroms.

5. The semiconductor device of claim 1, wherein the fluorine bearing spacers include $NF_3$ doped glass.

6. The semiconductor device of claim 1, wherein the fluorine bearing spacers include $NF_3$ doped glass and an oxide.

7. The semiconductor device of claim 6, further including dopant in regions of the substrate adjacent said at least one gate electrode.

8. The semiconductor device of claim 1, wherein each of the fluorine bearing spacers has a thickness of at least 1000 angstroms.

9. The semiconductor device of claim 1, wherein each of the fluorine bearing spacers includes an oxide.

10. A semiconductor device, comprising:

a substrate;

a gate electrode disposed on the substrate; and spacers disposed on the sidewalls of the gate electrode, each of the spacers having a sloping outer surface and including an oxide with $NF_3$ doped glass.

11. The semiconductor device of claim 10, wherein the oxide is $SiO_2$.

12. The semiconductor device of claim 10, wherein each of the spacers has a thickness of at least 1000 angstroms.

* * * * *